(12) United States Patent
Joumard et al.

(10) Patent No.: US 11,139,099 B2
(45) Date of Patent: Oct. 5, 2021

(54) MAGNETIC FIELD GENERATOR

(71) Applicants: Centre national de la recherche scientifique, Paris (FR); Commissariat à l'énergie atomique et aux énergies alternatives, Paris (FR)

(72) Inventors: Isabelle Joumard, Saint Egreve (FR); Ricardo Sousa, Grenoble (FR)

(73) Assignees: CENTRE NATIONAL DE LA RECHERCHE SCIENTIFIQUE, Paris (FR); COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 504 days.

(21) Appl. No.: 16/069,079

(22) PCT Filed: Jan. 5, 2017

(86) PCT No.: PCT/FR2017/050034
§ 371 (c)(1),
(2) Date: Jul. 10, 2018

(87) PCT Pub. No.: WO2017/121947
PCT Pub. Date: Jul. 20, 2017

(65) Prior Publication Data
US 2019/0027291 A1    Jan. 24, 2019

(30) Foreign Application Priority Data
Jan. 11, 2016 (FR) ..................... 1650184

(51) Int. Cl.
*H01F 7/20* (2006.01)
*G01R 33/12* (2006.01)
(Continued)

(52) U.S. Cl.
CPC .......... *H01F 7/20* (2013.01); *G01R 33/1207* (2013.01); *G11C 29/02* (2013.01);
(Continued)

(58) Field of Classification Search
CPC ....... H01F 7/20; H01F 7/064; G01R 33/1207; G11C 29/56016
(Continued)

(56) References Cited

U.S. PATENT DOCUMENTS 2,380,197 A * 7/1945 Sonnemann ......... H01H 53/015
361/209
3,930,212 A * 12/1975 Ioffe .................... B65G 47/24
335/284
(Continued)

FOREIGN PATENT DOCUMENTS

DE    102008020445    10/2009
JP    1987279504    12/1987
(Continued)

OTHER PUBLICATIONS

International Search Report for PCT/FR2017/050034, dated Jun. 20, 2017.
(Continued)

*Primary Examiner* — Alexander Talpalatski
(74) *Attorney, Agent, or Firm* — B. Aaron Schulman, Esq.; Stites & Harbison, PLLC

(57) ABSTRACT

The invention relates to a directional magnetic field generator with a magnetic circuit comprising: a first vertical-axis pole end (37) arranged above a horizontal plane; and at least two second pole ends (28A to 28D) symmetrically arranged on said horizontal plane, the generator further comprising coils arranged such that each magnetic circuit portion connecting two pole ends passes inside at least one coil, these coils being suitable for being connected to circuits for
(Continued)

circulating currents of adjustable intensity in selected directions therein.

11 Claims, 4 Drawing Sheets

(51) Int. Cl.

| | | |
|---|---|---|
| *G11C 29/56* | (2006.01) | |
| *H01F 27/28* | (2006.01) | |
| *G11C 29/02* | (2006.01) | |
| *H01F 7/06* | (2006.01) | |
| *G11C 29/50* | (2006.01) | |
| *H01L 43/00* | (2006.01) | |

(52) U.S. Cl.
CPC ....... *G11C 29/56016* (2013.01); *H01F 7/064* (2013.01); *H01F 7/202* (2013.01); *H01F 27/2823* (2013.01); *G11C 29/50008* (2013.01); *G11C 2029/5002* (2013.01); *G11C 2029/5006* (2013.01); *G11C 2029/5602* (2013.01); *H01L 43/00* (2013.01)

(58) Field of Classification Search
USPC ........................................................ 335/297
See application file for complete search history.

(56) References Cited

U.S. PATENT DOCUMENTS

| | | | |
|---|---|---|---|
| 5,539,366 A | 7/1996 | Dorri et al. | |
| 7,764,020 B2 * | 7/2010 | Barnett | H01F 7/0278 |
| | | | 315/5.35 |
| 10,497,503 B2 * | 12/2019 | Faley | H01J 29/56 |
| 2008/0180109 A1 | 7/2008 | Gregoritsch | |
| 2013/0056454 A1 | 3/2013 | Foulds et al. | |
| 2015/0123754 A1 | 5/2015 | Yu et al. | |
| 2017/0069415 A1 | 3/2017 | Faley et al. | |
| 2017/0207015 A1 * | 7/2017 | Premaratne | H01F 1/14708 |

FOREIGN PATENT DOCUMENTS

| | | |
|---|---|---|
| JP | H08264604 | 10/1996 |
| JP | 2003-069111 | 3/2003 |
| JP | 2010-212453 | 9/2010 |

OTHER PUBLICATIONS

Written Opinion of the International Search Authority for PCT/FR2017/050034, dated Jun. 20, 2017.
Preliminary Search Report for FR 1650184, dated Sep. 26, 2016.

* cited by examiner

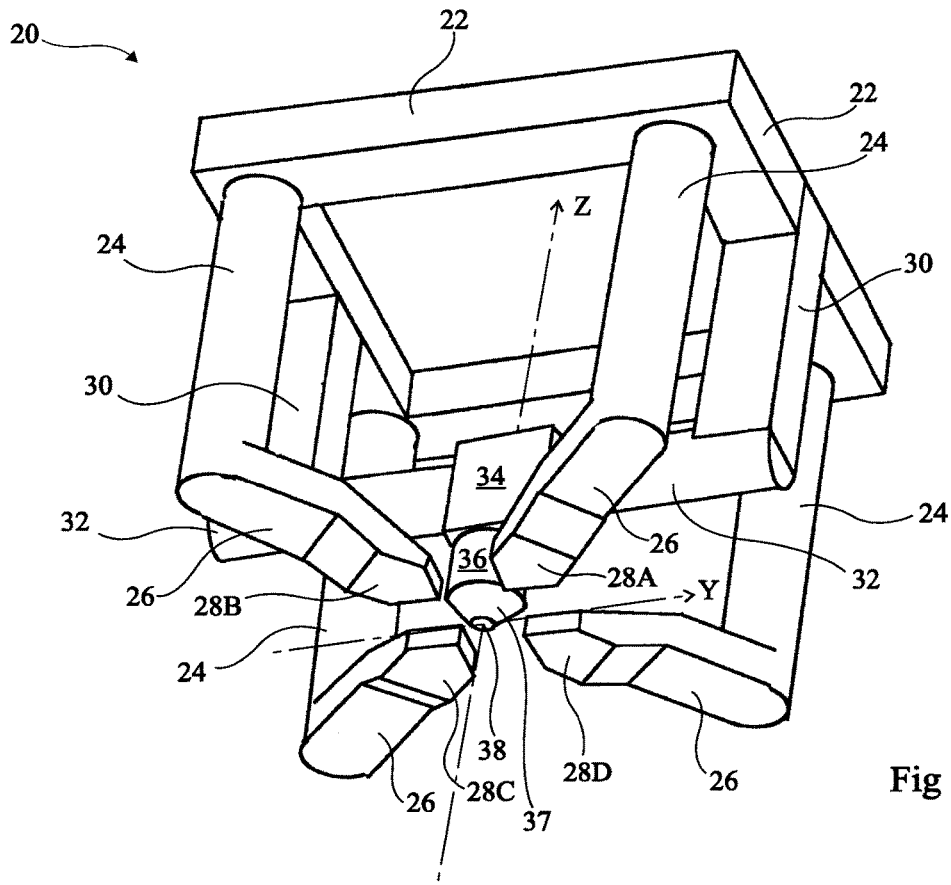
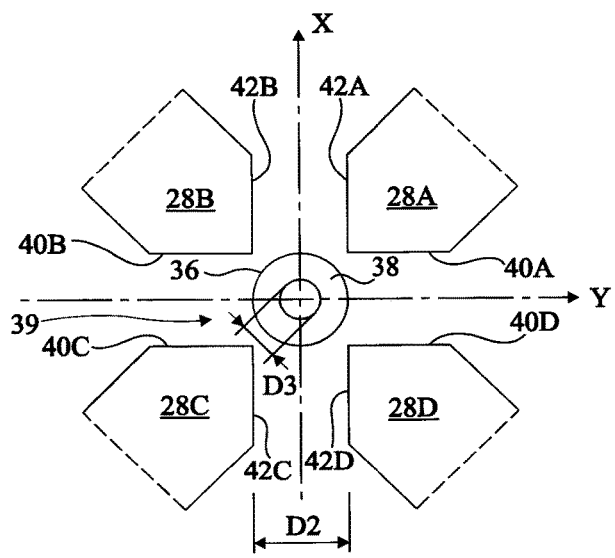
Fig 2A
Fig 2B

MAGNETIC FIELD GENERATOR

This patent application claims the priority benefit of French patent application number FR16/50184, filed on Jan. 11, 2016, the content of which is hereby incorporated by reference in its entirety.

BACKGROUND

The present disclosure relates to the field of magnetic field generators, and more particularly to a device generating a magnetic field of settable intensity and direction.

DISCUSSION OF THE RELATED ART

FIG. 1 shows an example of a magnetic memory cell 1 having characteristics which are desired to be verified.

A memory cell 1 is formed on a silicon wafer 3. The silicon wafer 3 is fixed on an X, Y, Z positioning device, not shown, of test equipment. The device makes it possible to position the wafer with an accuracy on the order of one micrometer. The memory cell comprises portions 5 of magnetic conductive layers located between two portions of metal layers 7. The metal layer portions are continued by contacts 9 located in a same horizontal plane on either side of the memory cell. There may, however, be a difference of a few micrometers between the contact levels.

To test the memory cell, test probes 11 are positioned on contacts 9, the distance D1 between the test probes 11 being on the order of some hundred micrometers. A magnetic field of settable intensity and direction is applied to the memory cell. The electric resistance variations between the test probes according to the intensity and to the direction of the magnetic field make it possible to characterize the memory cell 1.

It should be noted that, to position test probes 11 and create the magnetic field, only the space above the silicon wafer is available, the space under the wafer being used by the positioning device.

It is thus desired to have a magnetic field generator making it possible to generate a magnetic field of settable intensity and direction, the generator remaining entirely located above the surface of the wafer containing the memory cell.

More generally, it is desired to plunge, in a magnetic field of adjustable direction, components arranged on a wafer having only one available side to generate the magnetic field.

Known devices for generating a magnetic field in a half-space do not make it possible to adjust each vertical or horizontal component of the magnetic field independently from the other components and raise various implementation issues.

It is thus desired to have a magnetic field generator making it possible to generate, in a half-space, a magnetic field where each vertical and horizontal component can be independently adjusted.

SUMMARY

Thus, an embodiment provides a generator of a magnetic field of adjustable direction comprising a magnetic circuit comprising: a first polar end of vertical axis arranged above a horizontal plane; and at least two second polar ends arranged symmetrically on said horizontal plane, the generator further comprising coils arranged so that each magnetic circuit portion connecting two polar ends runs inside of at least one coil, the coils being capable of being connected to circuits capable of conducting currents of settable intensities and of selected directions therethrough.

According to an embodiment, the polar ends of each pair of second neighboring polar ends have parallel vertical surfaces arranged symmetrically with respect to a plane containing the vertical axis.

According to an embodiment, the first polar end has the shape of a truncated cone having a circular lower surface arranged at a height in the range from 0.5 to 5 mm above said horizontal plane.

According to an embodiment, the generator comprises four second polar ends symmetrical with respect to two orthogonal planes containing the vertical axis.

According to an embodiment, each polar end is at the end of an arm connected to a frame.

According to an embodiment, the arm associated with each second polar end horizontally extends a bar surrounded with a coil.

According to an embodiment, the arm associated with the first polar end is connected to a horizontal rod connected to the middles of opposite sides of the frame, a coil being arranged around each half of the horizontal rod.

According to an embodiment, the arm associated with the first polar end is surrounded with a coil.

According to an embodiment, the generator comprises two second polar ends, each of the first and second polar ends being at the end of an arm connected to a rod, the arm associated with the first polar end being connected to the center of the rod and a coil being arranged around each half of the rod.

According to an embodiment, the arm associated with the first polar end is surrounded with a coil.

BRIEF DESCRIPTION OF THE DRAWINGS

The foregoing and other features and advantages will be discussed in detail in the following non-limiting description of specific embodiments in connection with the accompanying figures, in which:

FIG. 2A is a perspective view of an embodiment of a magnetic circuit;

FIG. 2B is a bottom view of a portion of the magnetic circuit shown in FIG. 2A;

DETAILED DESCRIPTION

Figure 1:
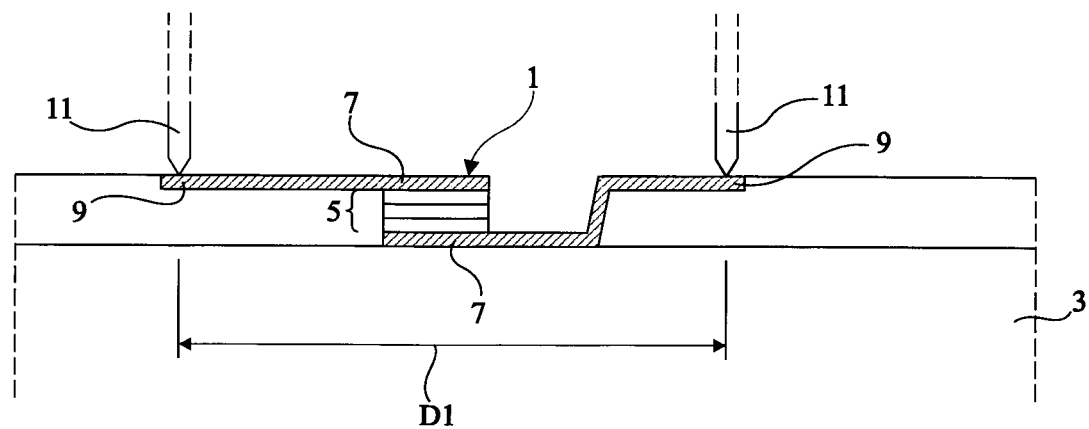
FIG. 1 shows an example of a magnetic memory cell.

The same elements have been designated with the same reference numerals in the various drawings and, further, the various drawings are not to scale. For clarity, only those elements which are useful to the understanding of the described embodiments have been shown and are detailed. In particular, coil power supply circuits are not shown.

In the following description, unless otherwise specified, when reference is made to terms qualifying absolute positions, such as terms "left", "right", etc., or relative positions, such as terms "top", "bottom", "lower", etc., or to terms qualifying orientation, such as terms "horizontal", "vertical", reference is made to the orientation of the concerned element in the targeted drawing. Unless otherwise specified, the expression "on the order of" means, concerning an orientation, to within 10 degrees, preferably to within 5 degrees.

Figure 2C:
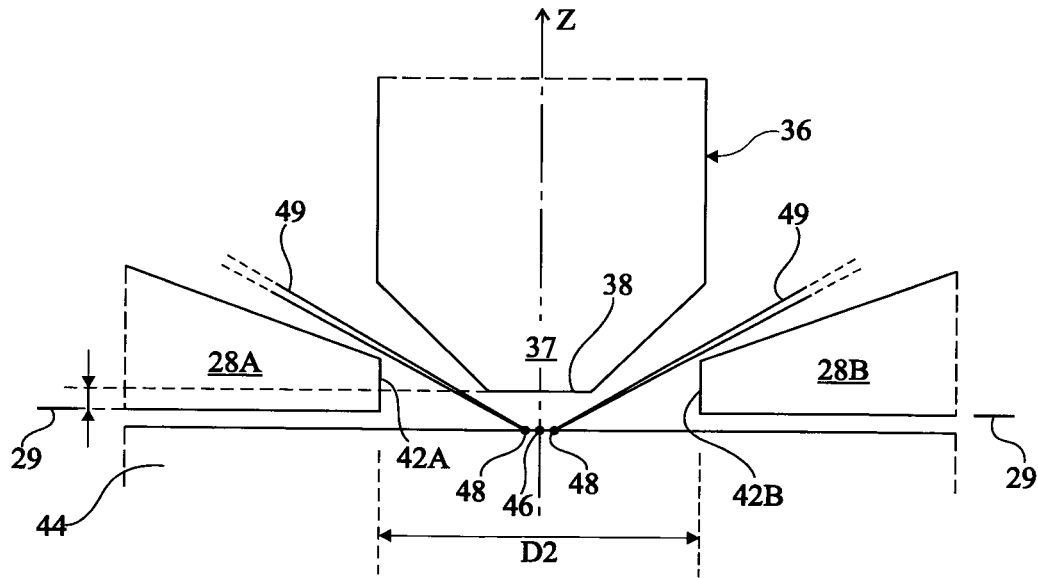
FIG. 2C is a side view of a portion of a magnetic circuit positioned above a wafer to be tested.

FIG. 2A is a perspective view of an embodiment of a magnetic circuit 20 of a magnetic field generator. The generator comprises coils, not shown in FIG. 2A, arranged around certain portions of the magnetic circuit. FIG. 2B is a bottom view, at a different scale, of a portion of magnetic circuit 20 close to vertical axis Z of the generator. FIG. 2C is a side view, at a different scale, of a portion of magnetic circuit 20 positioned above a wafer containing a magnetic memory cell to be tested.

The magnetic circuit is made of a soft ferromagnetic material, for example soft iron. Magnetic circuit 20 comprises a square frame 22 with axis Z. A cylindrical vertical bar 24 extends downwards from each of the corners of frame 22. Each bar 24 is continued towards axis Z by a radial arm 26. Each radial arm 26 is continued by a respective point-shaped polar end 28A to 28D directed towards axis Z. Polar ends 28A to 28D have lower surfaces located in a same horizontal plane 29 (shown in FIG. 2C). As an example, frame 22 is inscribed within a circle having a diameter in the range from 100 to 200 mm. The dimension along axis Z, or height, of the general circuit is in the range from 100 to 200 mm. Each bar 24 may have a diameter in the range from 8 to 20 mm.

Bars 30 extend vertically downwards from the middles of two opposite sides of frame 22. The ends of bars 30 are connected by a horizontal rod 32. A connection block 34 centered on axis Z is located in the middle of rod 32. Connection block 34 is continued downwards by a vertical cylindrical arm 36. Cylindrical arm 36 has a polar end 37 in the form of a truncated cone with axis Z. The cone ends with a circular horizontal surface 38 located at a height H above horizontal plane 29.

In bottom view, as illustrated in FIG. 2B, polar ends 28A to 28D delimit a cross-shaped space 39 having its center occupied by polar end 37. The cross is arranged along horizontal axes having directions X and Y, axis Y being parallel to the direction of rod 32. Thus, polar ends 28A to 28D are arranged symmetrically with respect to two orthogonal vertical planes running through axis Z. Polar ends 28A to 28D may have respective vertical surfaces 40A to 40D parallel to axis Y. Polar ends 28A to 28D may have respective vertical surfaces 42A to 42D parallel to axis X. As an example, distances D2 separating the vertical surfaces of neighboring polar ends 28A to 28D are equal and in the range from 5 to 15 mm.

FIG. 2C is a side cross-section view illustrating a lower portion of the magnetic field generator opposite a wafer 44 comprising a magnetic memory cell 46 provided with contacts 48. The wafer is fixed to a positioning device, not shown. The magnetic field generator is arranged in such a way that horizontal plane 29 of the magnetic field is located above the upper surface of wafer 44, the memory cell being arranged under surface 38 of polar end 37. The generator structure is such that a space is available to position test probes 49 on contacts 48. As an example, the height between horizontal plane 29 and the upper surface of the wafer is in the range from 0.5 to 5 mm.

Figure 3:
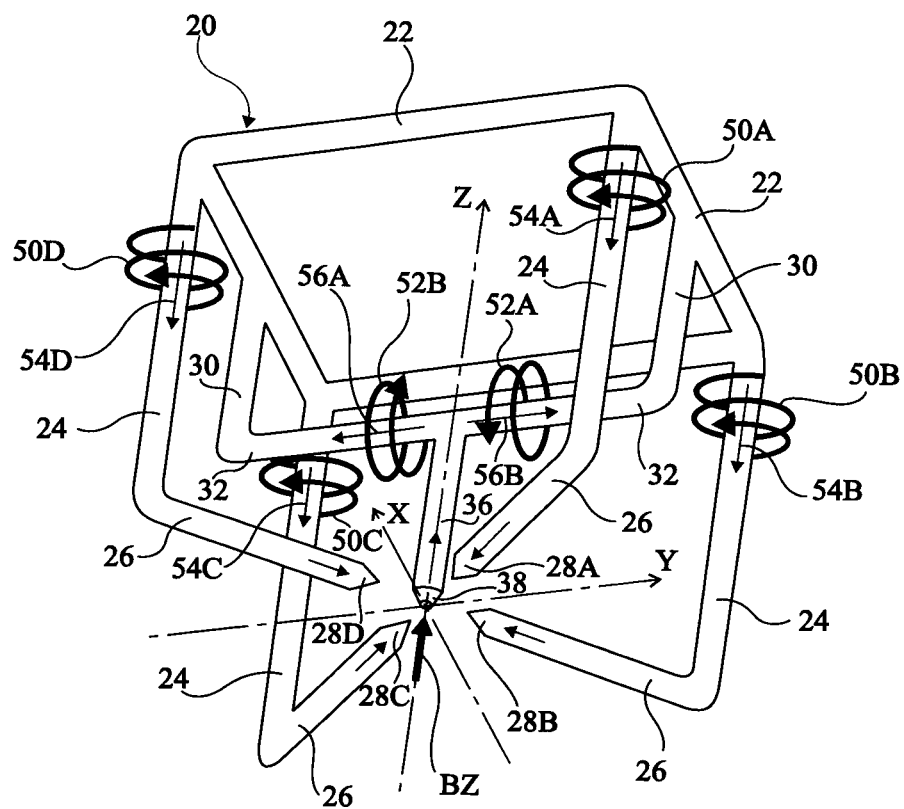
FIG. 3 is a simplified illustration of the magnetic circuit shown in FIG. 2A and of coils conducting currents.

FIG. 3 is a simplified illustration of magnetic circuit 20 shown in FIG. 2A and of coils conducting currents according to an example configuration of currents. Each element of magnetic circuit 20 is shown in the form of a cylinder elongated along the propagation direction of a magnetic conduction flux conducted by the element. As an example, the real coils have outer diameters in the range from 50 to 70 mm. Each coil may be formed by coiling of a copper conductive wire, the number of turns of the conductive wire depending on the wire diameter. Each coil may comprise several hundreds of turns of conductive wire, for example, from 200 to 3000 turns.

Each bar 24 associated with one of ends 28A to 28D has a respective coil 50A to 50D arranged around it. Coils 52A and 52B are arranged around the portions of rod 32 located on either side of the connection with arm 36. Coils 50A to 50D, 52A and 52B may be identical.

The coils are connected to power supply circuits, not shown. These circuits make it possible to conduct a current of selected direction and intensity in each coil.

In the example configuration of currents illustrated in FIG. 3, currents of identical intensity and direction flow through coils 50A to 50D to generate, in bars 24, magnetic conduction fluxes 54A to 54D oriented downwards. Currents of opposite intensity and direction flow through coils 52A and 52B. The currents in coils 52A and 52B generate respective magnetic induction fluxes 56A and 56B extending away from axis Z, which results in a flux directed upwards in vertical arm 36.

As previously indicated, polar ends 28A to 28D are symmetrical with respect to two orthogonal vertical planes running through axis Z. Thereby, on vertical axis Z, the field components along axis X and along axis Y cancel each other out. Thus, magnetic field BZ created under polar end 37 around the magnetic memory cell of FIG. 2C is directed upwards along vertical axis Z. The conical shape of polar end 37 makes it possible to concentrate, in the cone, the magnetic induction which propagates in the arm. The inventors have shown by means of simulations that there exists an optimal value of height H separating plane 29 from surface 38, which provides a quasi-uniform magnetic field having a maximum intensity under polar end 37, for example corresponding to a magnetic induction greater than 0.5 T. As an example, height H is in the range from 0.5 to 2 mm. Surface 38 may have a diameter in the range from 3 to 7 mm. The angle between axis Z and the inclined surface of the cone may have value in the range from 40 to 60 degrees. Arm 36 may have a diameter in the range from 8 to 20 mm.

A magnetic field directed along axis Y defined in relation with FIG. 2B and oriented from left to right is obtained if, based on the configuration of currents of FIG. 3, the directions of the currents in coils 50A, 50B and 52A, are reversed. In this case, the magnetic conduction fluxes generated by the coils cancel in the vertical arm 36. As previously indicated, ends 28A to 28D may have respective vertical surfaces 42A to 42D parallel to axis X. Such an arrangement of surfaces 42A to 42D provides a quasi-uniform magnetic field with no component along axis X under surface 38. Further, the dimension along axis Z or thickness of polar ends 28A to 28D may be smaller than the thickness of arms 26, to obtain a high magnetic field. The currents in coils 52A and 52B may also be canceled, and the generator then generates a magnetic field along axis Y of small intensity.

A magnetic field oriented along axis X is obtained from the current configuration illustrated in FIG. 3 by reversing the directions of the currents in coils 50A and 50D and by canceling the currents in coils 52A and 52B. The operation is similar to the operation which generates a field oriented along axis Y.

Generally, by combinations of currents of selected intensities and directions flowing through the coils, one may advantageously select the orientation and the intensity of the magnetic field under polar end 37 in a volume located under plane 29, the magnetic field generator being entirely located above plane 29.

Although coils arranged around elements of magnetic circuit 20 have been described hereabove in a specific configuration, other configurations are possible. As a variation, coils 50A to 50D may be replaced by coils located around the sides of frame 22. A coil may be arranged around each side of frame 22 parallel to axis Y. Each side parallel to axis X may be surrounded with two coils arranged on either side of vertical bar 30. In another variation, coils 52A and 52B may be replaced with a single coil arranged around arm 36. In this case, bars 30 may be suppressed, rod 32 being directly connected to the middle of the associated sides of frame 22.

Figure 4A:
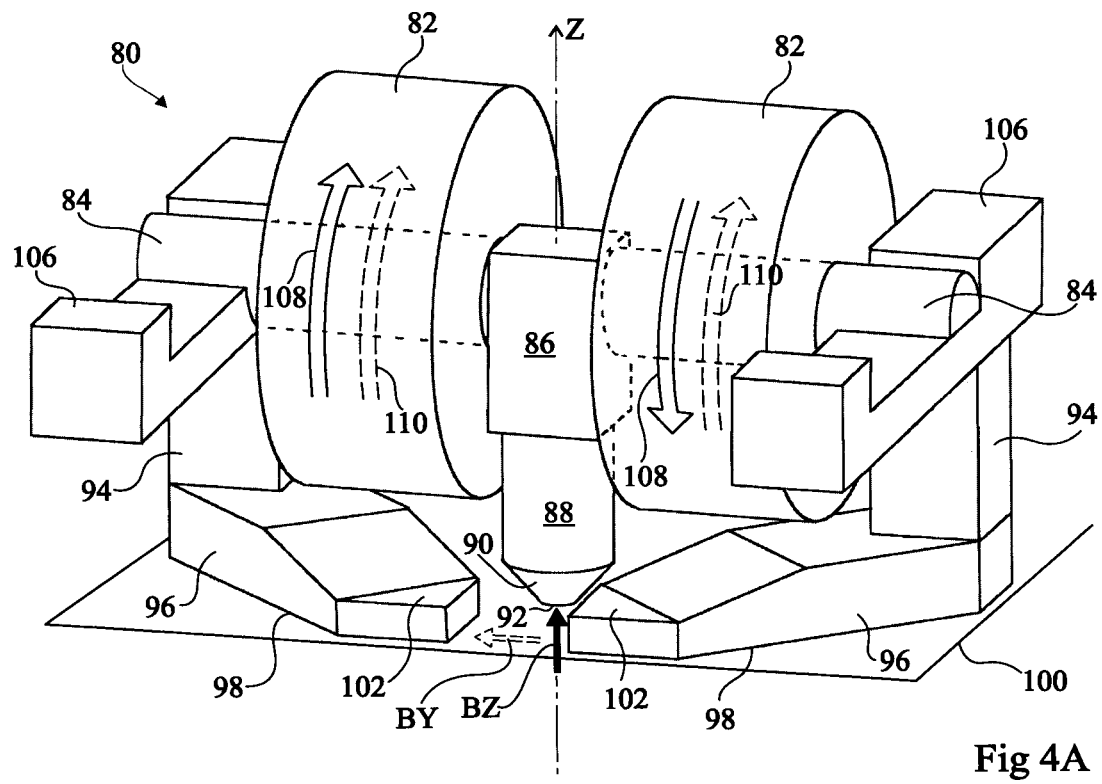
FIG. 4A is a perspective view of a simplified embodiment of a magnetic field generator.
Figure 4B:
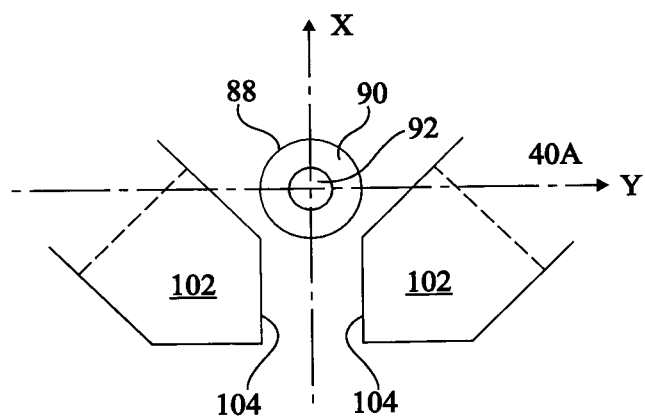
FIG. 4B is a bottom view of the generator of FIG. 4A.

FIG. 4A is a perspective view of an embodiment of a magnetic field generator 80. FIG. 4B is a bottom view of a portion of the magnetic circuit of generator 80 close to axis Z.

Magnetic field generator 80, simpler than above-described generator 20, provides a magnetic field of selected intensity having an adjustable direction in plane YZ. The generator comprises two identical coils 82 arranged around a horizontal rod 84 on either side of a connection block 86 located in the middle of rod 84. Connection block 86 is continued downwards by a cylindrical arm 88. Cylindrical arm 88 has a polar end 90 in the form of a truncated cone with axis Z. The cone ends with a circular horizontal surface 92. Vertical bars 94 extend from the ends of rod 84 and are horizontally continued by converging arms 96. Arms 96 have lower surfaces 98 comprised in a horizontal plane 100 common to the two surfaces and located at a height H under surface 92. In bottom view, the arms extend towards axis Z. As an example, arms 96 extend towards axis Z along directions forming angles on the order of 45° with the direction of horizontal rod 84. Each arm 96 ends with a polar end 102. Polar ends 102 have two parallel vertical surfaces 104 perpendicular to axis Y and symmetrical with respect to a plane running through axis Z.

In the shown embodiment, horizontal supports 106 extend from each end of rod 84 and make it possible to fix the generator.

Figure 5:
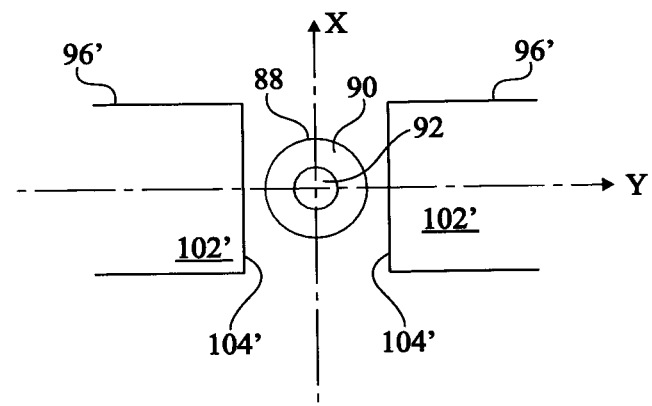
FIG. 5 is a partial bottom view of an alternative magnetic circuit.

FIG. 5 is a partial bottom view of a variation of a magnetic circuit, corresponding to the magnetic circuit shown in FIGS. 4A and 4B where arms 96 have been replaced with similar arms 96' provided with polar ends 102'. Conversely to arms 96 of FIGS. 4A and 4B, arms 96' extend towards axis Z parallel to the direction of horizontal rod 84. Axis Z is located between parallel vertical surfaces 104' of polar ends 102'. Vertical surfaces 104' are orthogonal to axis Y and symmetrical with respect to a plane running through axis Z.

In the embodiment illustrated in FIGS. 4A and 4B and in the variation of FIG. 5, coils 82 are connected to circuits, not shown, making it possible to conduct a current of selected intensity and direction in each coil.

When currents 108 having equal intensities and opposite directions flow through coils 82, the magnetic conduction fluxes created in each half of the rod by each of the currents add in bar 88. A magnetic field B2 directed along axis Z under surface 92 of polar end 90 is then obtained. When currents 110 of same direction flow through the coils, a magnetic field directed along axis Y is obtained. Generally, a combination of currents in coil 82 provides a current of settable intensity and having a selected orientation in plane YZ.

Magnetic field generator 80 is entirely located above plane 100 and makes it possible, with two coils only, to generate, in a volume located under plane 100, a magnetic field having an intensity and direction in plane YZ which may be adjusted.

In a variation, not shown, a coil may be arranged around vertical arm 88, to increase the intensity of the magnetic field component along axis Z.

Specific embodiments have been described. Various alterations, modifications, and improvements will readily occur to those skilled in the art. In particular, although specific configurations of magnetic circuits and of coils have been described, other configurations are possible, the essential point being, on the one hand, for the magnetic circuit to comprise a vertical arm provided with a polar end located above a horizontal plane and to comprise at least two symmetrical polar ends arranged on the horizontal plane, and on the other hand for each magnetic circuit portion connecting two of the polar ends to run inside of at least one coil. Further, in the described embodiments, magnetic field generators are used to test a magnetic memory cell formed on a silicon wafer by connecting the memory cell with test probes. A generator of the described type may also be used to perform magneto-optical tests of a magnetic memory cell arranged on a wafer, one side of the wafer then being used by the generator and the other side remaining available for optical devices. Such a generator may also be used to simultaneously test a plurality of magnetic memory cells, or to test memory cell arrays.

The invention claimed is:

1. A generator of a magnetic field of adjustable direction including a magnetic circuit comprising:
   a first polar end of vertical axis arranged above a horizontal plane; and
   at least two second polar ends arranged symmetrically on said horizontal plane,
   the generator further comprising coils arranged so that each magnetic circuit portion connecting two polar ends runs inside at least one coil, the coils being adapted to be connected to circuits configured to conduct currents of settable intensities and of selected directions therethrough,
   wherein the polar ends of each pair of second neighboring polar ends have parallel vertical surfaces arranged symmetrically with respect to a plane containing the vertical axis.

2. The generator according to claim 1, wherein the first polar end has the shape of a truncated cone having a circular lower surface arranged at a height (H) in the range from 0.5 to 5 mm above said horizontal plane.

3. The generator according to claim 1, comprising four second polar ends symmetrical with respect to two orthogonal planes containing the vertical axis.

4. The generator according to claim 3, wherein each polar end is at the end of an arm connected to a frame.

5. The generator according to claim 4, wherein the arm associated with each second polar end horizontally extends a bar surrounded with a coil.

6. The generator according to claim 4, wherein the arm associated with the first polar end is connected to a horizontal rod connected to the middles of opposite sides of the frame, a coil being arranged around each half of the horizontal rod.

7. The generator according to claim 5, wherein the arm associated with the first polar end is surrounded with a coil.

8. The generator according to claim 1, comprising two second polar ends, each of the first and second polar ends being at the end of an arm connected to a rod, the arm associated with the first polar end being connected to the center of the rod, and a coil being arranged around each half of the rod.

9. The generator according to claim 8, wherein the arm associated with the first polar end is surrounded with a coil.

10. A generator of a magnetic field of adjustable direction including a magnetic circuit comprising:
- a first polar end of vertical axis arranged above a horizontal plane; and
- at least two second polar ends arranged symmetrically on said horizontal plane,
- the generator further comprising coils arranged so that each magnetic circuit portion connecting two polar ends runs inside at least one coil, the coils being adapted to be connected to circuits configured to conduct currents of settable intensities and of selected directions therethrough, and comprising four second polar ends symmetrical with respect to two orthogonal planes containing the vertical axis,
- wherein each polar end is at the end of an arm connected to a frame; and
- wherein the arm associated with each second polar end horizontally extends a bar surrounded with a coil.

11. A generator of a magnetic field of adjustable direction including a magnetic circuit comprising:
- a first polar end of vertical axis arranged above a horizontal plane; and
- at least two second polar ends arranged symmetrically on said horizontal plane,
- the generator further comprising coils arranged so that each magnetic circuit portion connecting two polar ends runs inside at least one coil, the coils being adapted to be connected to circuits configured to conduct currents of settable intensities and of selected directions therethrough, and comprising four second polar ends symmetrical with respect to two orthogonal planes containing the vertical axis,
- wherein each polar end is at the end of an arm connected to a frame; and
- wherein the arm associated with the first polar end is connected to a horizontal rod connected to the middles of opposite sides of the frame, a coil being arranged around each half of the horizontal rod.

\* \* \* \* \*